United States Patent
Zagar et al.

[11] Patent Number: 6,044,433
[45] Date of Patent: *Mar. 28, 2000

[54] DRAM CACHE

[75] Inventors: Paul S. Zagar; Mirmajid Seyyedy, both of Boise, Id.

[73] Assignee: Micron Technology, Inc., Boise, Id.

[ * ] Notice: This patent is subject to a terminal disclaimer.

[21] Appl. No.: 08/695,013

[22] Filed: Aug. 9, 1996

[51] Int. Cl.[7] ............................................ G06F 12/08
[52] U.S. Cl. ................................. 711/105; 711/118
[58] Field of Search .................... 711/105, 118; 365/230.08, 189.05

[56] References Cited

U.S. PATENT DOCUMENTS

| | | | |
|---|---|---|---|
| 4,870,622 | 9/1989 | Aria et al. | 365/230.02 |
| 5,159,676 | 10/1992 | Wicklund et al. | 395/425 |
| 5,276,843 | 1/1994 | Tillinghast et al. | 395/425 |
| 5,577,223 | 11/1996 | Tanoi et al. | 711/118 |
| 5,586,078 | 12/1996 | Takase et al. | 365/230.03 |
| 5,596,521 | 1/1997 | Tanaka et al. | 365/49 |
| 5,699,317 | 12/1997 | Sartore et al. | 365/230.06 |
| 5,712,827 | 1/1998 | Ogihara et al. | 365/230.03 |
| 5,721,862 | 2/1998 | Sartore et al. | 711/118 |
| 5,734,614 | 3/1998 | Tsuruda et al. | 365/189.05 |
| 5,787,457 | 7/1998 | Miller et al. | 711/105 |
| 5,802,002 | 9/1998 | Ienaga | 365/207 |

*Primary Examiner*—Eddie P. Chan
*Assistant Examiner*—Kevin Verbrugge
*Attorney, Agent, or Firm*—Schwegman, Lundberg, Woessner & Kluth, P.A.

[57] ABSTRACT

A dynamic memory is described which uses a multiplexed latch architecture and global bit lines. The multiplexed architecture allows the memory to operate as a synchronous pipelined cache memory in a computer processing system. The global bit lines are fabricated parallel to memory array bit lines and input/output connections are distributed around the memory to increase speed. Page access operations are controlled to allow either single or burst writes.

23 Claims, 10 Drawing Sheets

DRAM CACHE

TECHNICAL FIELD OF THE INVENTION

The present invention relates generally to cache memory devices and in particular the present invention relates to a DRAM cache memory device.

BACKGROUND OF THE INVENTION

The performance of computer systems, especially personal computers, has improved dramatically due to the rapid growth in computer architecture design and in particular to the performance of computer memory.

Computer processors and memories however have not pursued the same pace of development through the years. Memories are not able to deliver enough response speed to processors. To reduce the gap in speed between the processors and memories, the concept of memory hierarchy was introduced. A memory hierarchy comprises a number of different memory levels, sizes and speeds. The memory located near or inside the processor is usually the smallest and fastest and is commonly referred to as cache memory. Cache memory plays an important role in the computer memory hierarchy. Computer instructions and data which are most likely to be reused are stored temporarily in the cache memory because the processor can access these instructions or data much faster than accessing them from the slower computer main memory. Cache memory needs to be fast to accommodate the demand of the processor. Therefore, it is usually constructed from static-type memory or static random access memory (SRAM). SRAM's, however, do not have the memory density of comparable dynamic memories. For an example of an SRAM and additional background in the terminology and specifications for an SRAM see 1995/1996 SRAM DATA BOOK, pages 1–145 to 1–159, provided by Micron Technology, Inc., the assignee of the present invention, which is incorporated herein by reference.

For the reasons stated above, and for other reasons stated below which will become apparent to those skilled in the art upon reading and understanding the present specification, there is a need in the art for a dynamic random access memory (DRAM) which can be used for cache memory.

SUMMARY OF THE INVENTION

The above-mentioned problems with cache memory devices and other problems are addressed by the present invention and which will be understood by reading and studying the following specification. A DRAM memory is described which uses multiplexed global bit lines and latch circuits to communicate data with I/O lines. The DRAM operates as a synchronous pipelined memory.

In particular, the present invention describes a dynamic memory device comprising dynamic memory cells, bit lines, access devices connected between the dynamic memory cells and the bit lines for selectively coupling one of the dynamic memory cells to one of the bit lines, and global bit lines coupled to the bit lines. The memory also comprises addressing circuitry to electrically connect the global bit lines to latch circuits, and a multiplex circuit connected between the latch circuits and an input/output connection for coupling one of the latch circuits to the input/output connection.

In another embodiment, a processing system is described which comprises a central processing unit, a main memory, and a DRAM cache memory. The DRAM comprising dynamic memory cells, bit lines, access devices connected between the dynamic memory cells and the bit lines for selectively coupling one of the dynamic memory cells to one of the bit lines, and global bit lines coupled to the bit lines. The memory also comprises addressing circuitry to electrically connect the global bit lines to latch circuits, and a multiplex circuit connected between the latch circuits and an input/output connection for coupling one of the latch circuits to the input/output connection.

In another embodiment a method of outputting data from a dynamic memory device is described. The method comprises the steps of reading data from dynamic memory cells, coupling the data to global bit lines, coupling the global bit lines to latch circuits, and latching the data in the latch circuits. The method further comprises multiplexing one of the latch circuits to a data input/output connection on a first clock signal, and multiplexing different ones of the latch circuits to the data input/output connection on subsequent clock signals.

In yet another embodiment a method of inputting data to a dynamic memory device is described. The method comprises the steps of coupling memory cells to global bit lines, connecting the global bit lines to latch circuits, receiving data on an input/output connection, multiplexing one of the latch circuits to the input/output connection on a first clock signal to latch the data, and multiplexing different ones of the latch circuits to the data input/output connection on subsequent clock signals to latch the data.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1A:
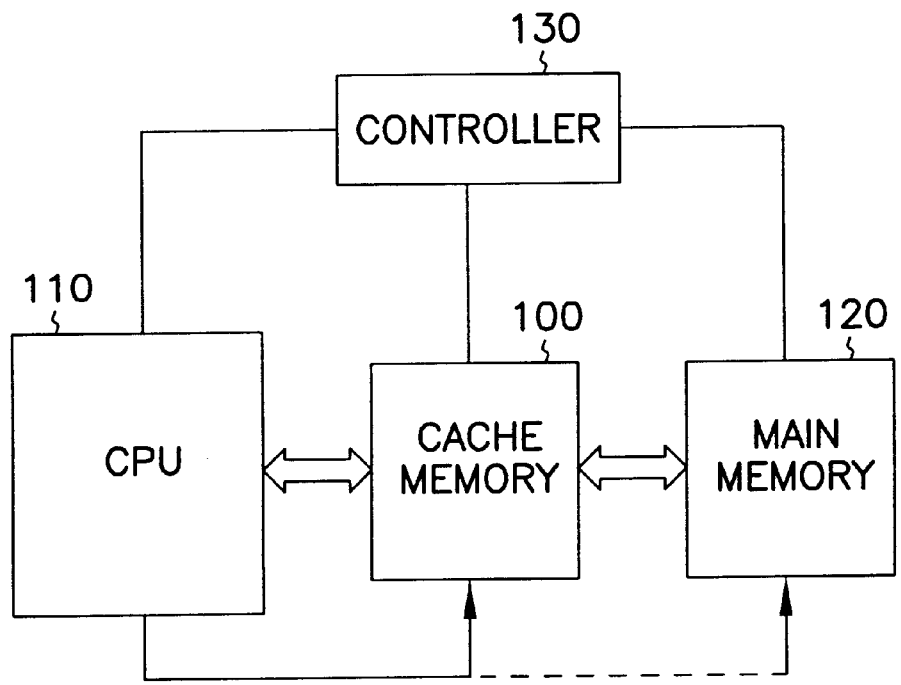
FIG. 1a is a block diagram of a processing system incorporating the DRAM cache memory of the present invention.
Figure 1B:
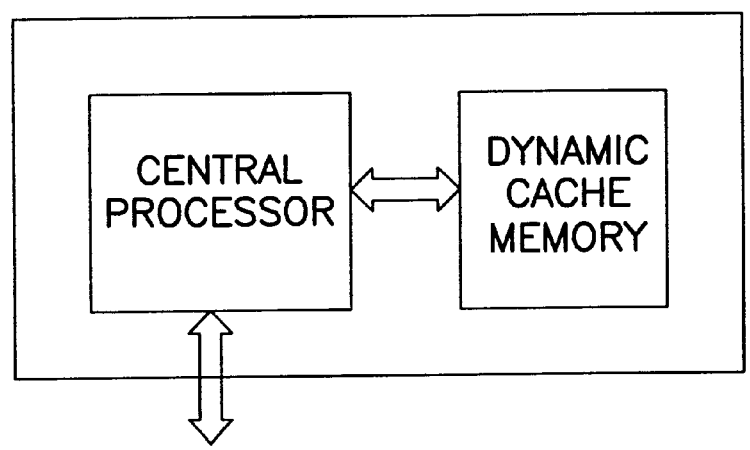
FIG. 1b is a diagram of a processing unit incorporating the DRAM cache memory of the present invention.

FIG. 1a is a block diagram of a processing system incorporating the high bandwidth cache memory device of the present invention. The system includes a central processing unit (CPU) 110, a main memory 120, DRAM cache memory 100, and an optional controller 130 for controlling communication between the CPU and memories. The CPU can communicate with the cache memory, or optionally with the main memory, as indicated by the dashed line. As stated above, typical cache memories are SRAM's. SRAM's are faster than typical DRAM's, but have a smaller memory density. That is, a typical DRAM may have 16 Mega bits of memory arranged as 1 Mega bit by 16 bits, while a typical SRAM may have only 128k bytes of memory arranged as 32k by 32 bits. A DRAM memory having the architecture and data path described herein will have high bandwidth, high density, and high operating speeds for use as a cache memory. For example, a DRAM cache memory may have 16 Mega bits of memory arranged as 512k bits by 32 bits. FIG. 1b illustrates an integrated circuit package which includes both a central processing unit and cache DRAM circuitry. The single package processing unit, therefore, reduces the communication time between the processor and the memory circuit. Further, it will be appreciated that the processor and the memory can be incorporated on the same integrated die.

Figure 2:
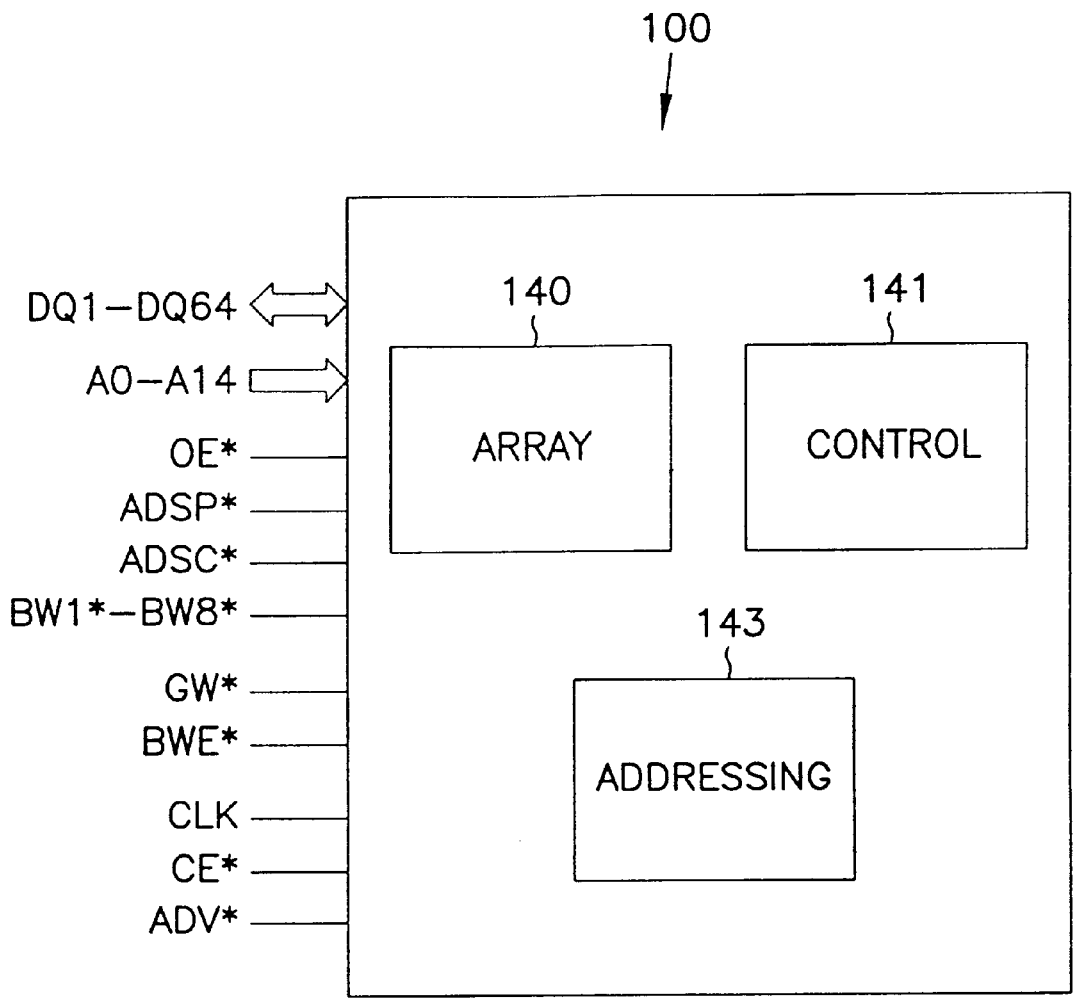
FIG. 2 is a block diagram of the DRAM cache memory.

The cache memory of the present invention can be provided in any size, for example, FIG. 2 illustrates a 4 Mega Bit DRAM of the present invention having 64 data input/output connections, or communication lines (DQ1–DQ64). The memory is designed to be interchangeable with existing synchronous pipelined SRAM's. Control circuitry 141, memory array 140, and addressing circuitry 143 are provided in the memory. The input lines of the DRAM, therefore, correspond to the inputs of the SRAM. These inputs include Output Enable (OE*), Block Writes (BW1*–BW8*) Global Write (GW*), Block Write Enable (BWE*), Clock (CLK), Chip Enable (CE*), Synchronous Address Advance (ADV*), Synchronous Address Status Processor (ADSP*), and Synchronous Address Status Controller (ADSC*). Other inputs known to those skilled in the art can be provided. For a description of a synchronous SRAM see 1995/1996 SRAM DATA BOOK, pages 1–145 to 1–159, available from MICRON Technology, Inc.

Figure 3:
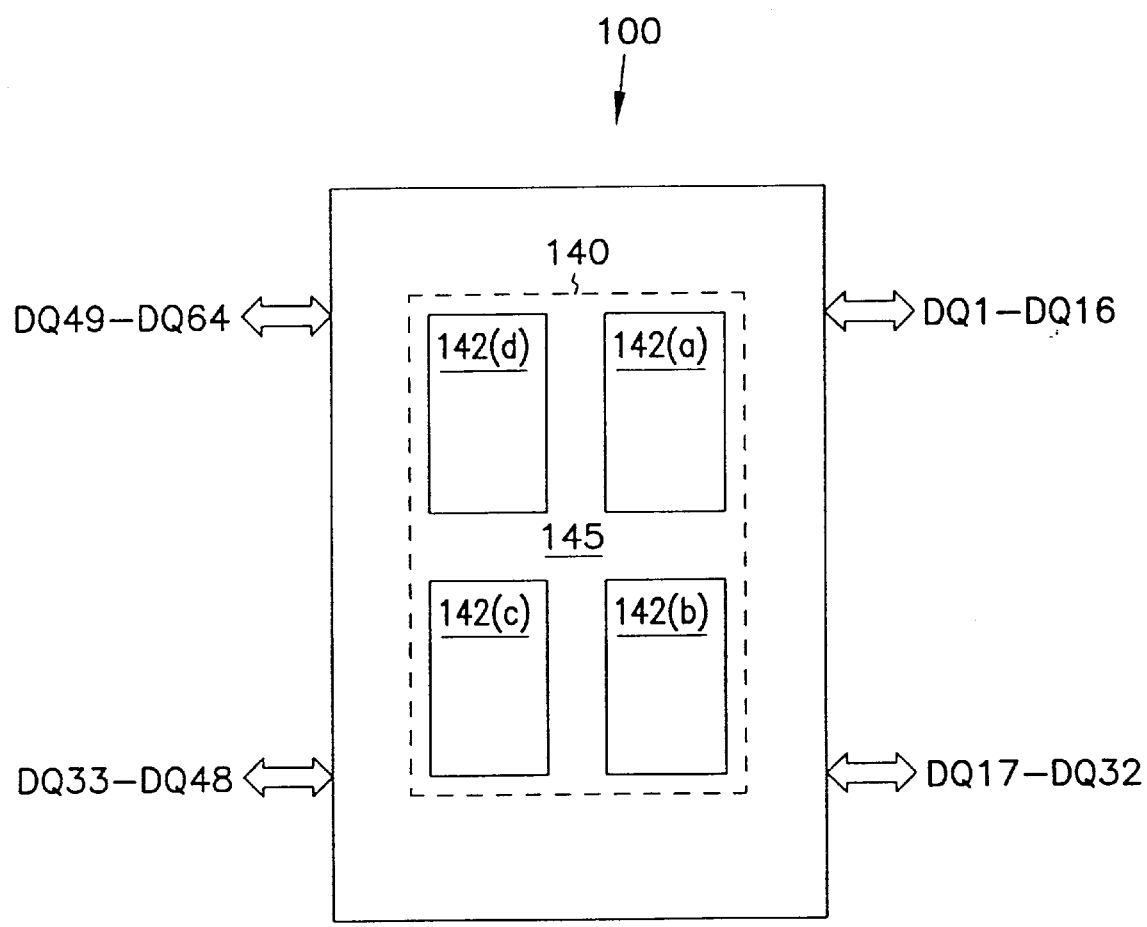
FIG. 3 is a detailed diagram of one embodiment of the memory array in the DRAM cache memory of FIG. 2.

As shown in FIG. 3, one embodiment of the DRAM of the present invention has a memory array 140 arranged in four sub-array sections 142 (a)–(d) having memory cells and sense amplifier circuitry. The DQ input/outputs are distributed around the memory to reduce the communication time with the array sub-sections. Additional circuitry 141 and 143 are provided for addressing the memory cells and controlling the operation of the memory as shown in FIG. 2. This additional circuitry can be located in the gaps 145 between the sub-arrays and around the periphery of array 140. For simplicity, the addressing and control circuitry is not described herein, but known to those skilled in the art. Each sub-array section has memory cells arranged in rows and columns of memory cells. Each column is divided into bit line sections which are connected to a sense amplifier circuit. The column sections are arranged in a folded bit line structure to maximize memory cell density.

Figure 4:
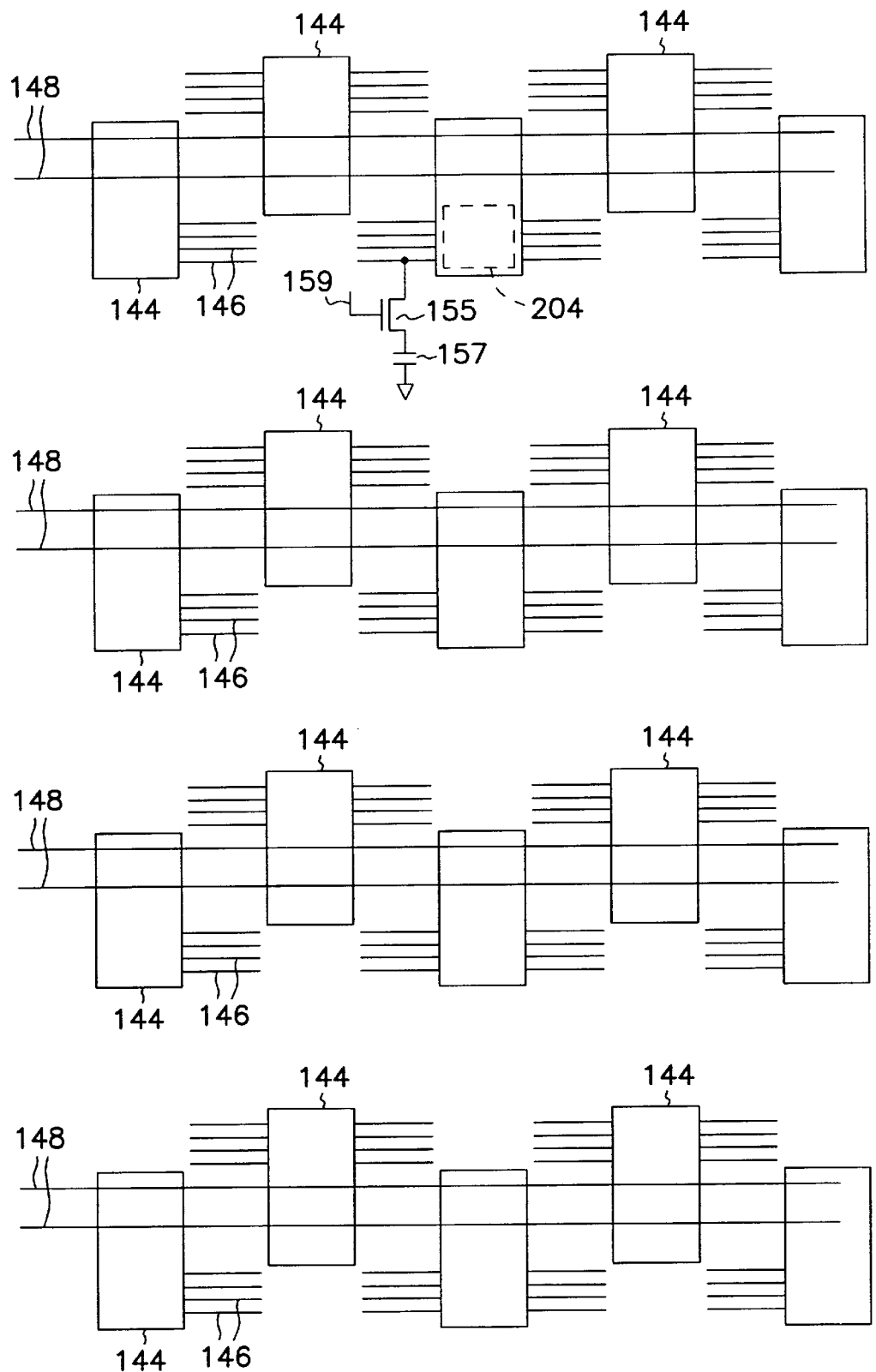
FIG. 4 is a schematic of four global bit lines of the memory array of FIG. 2.

FIG. 4 shows four columns of sub-array section 142(d) having folded bit lines. Each sense amplifier circuit 144 has at least one pair of bit lines 146 which can be selectively coupled to one of 256 memory cells 157 by activating access transistor 155 with a corresponding word line 159. Only one memory cell has been shown in FIG. 4 for simplicity. The 4 Meg memory circuit of FIG. 3 has five sense amplifier circuits 144 associated with one global bit line pair 148. Each sense amplifier circuit can couple one of four bit line pairs 146 to the global bit line, as shown in FIG. 4. The global bit lines 148 are fabricated parallel to bit lines 146. The global bit lines can be selectively coupled to one of the five sense amplifier circuits 144. A portion of addressing circuitry 143, therefore, is provided in the gaps 145 to select the appropriate sense amplifier and bit line pair for communication with the global bit line. Another portion of addressing circuitry 143 is also provided to activate a word line 159 to couple a memory cell 157 to a bit line 146, as known to those skilled in the art. The 4 Meg memory circuit of FIG. 2 has 256 global bit lines per sub-array section 142, for a total of 2048 global bit lines. Further, each bit line pair can be coupled to one of 256 memory cells.

Figure 5:
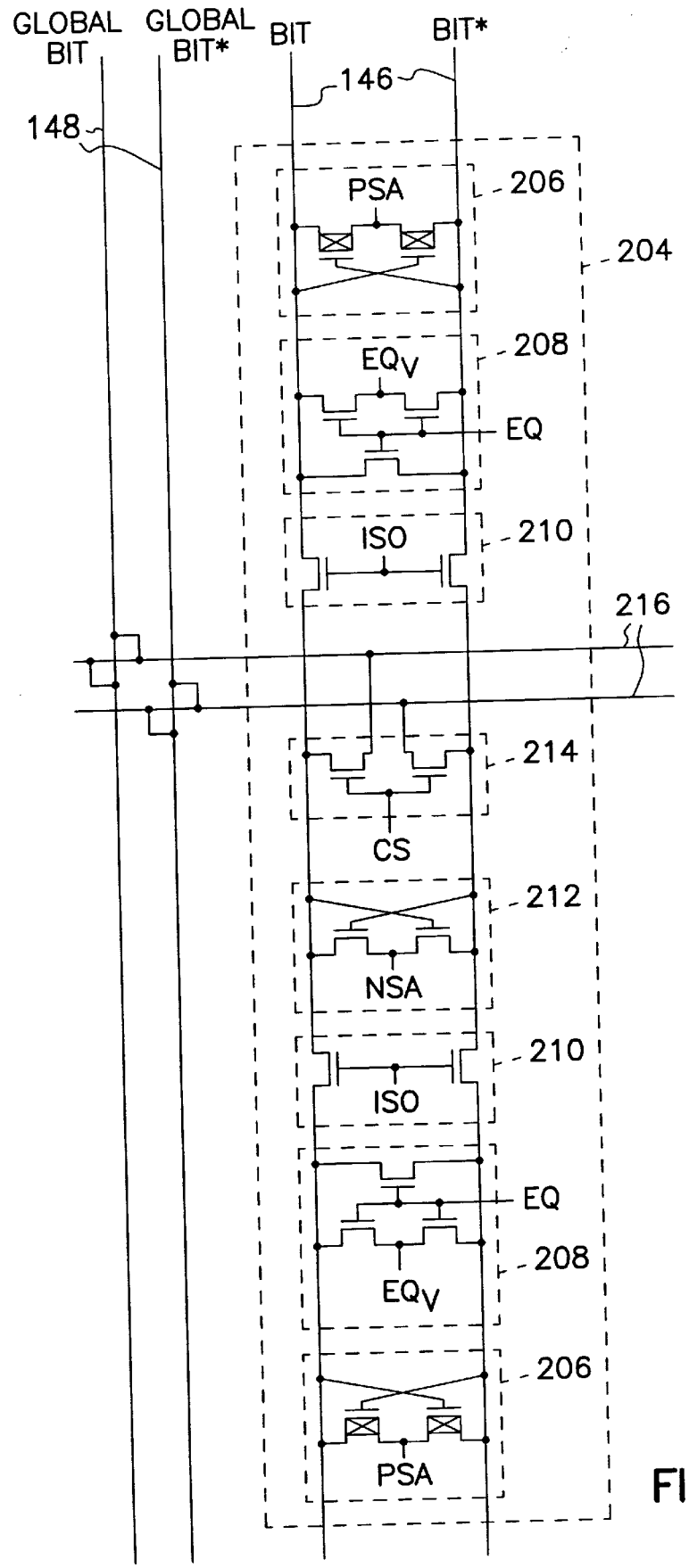
FIG. 5 is a schematic diagram of sense amplifier and I/O devices included in the schematic of FIG. 4.

A portion of the sense amplifier circuitry 144 illustrated in FIG. 4 is described in more detail with reference to FIG. 5. Each pair of bit lines 146 has a dedicated cross coupled pair differential p-sense amplifier circuit 206 which is activated by an appropriate signal on the PSA line. Further, each bit line pair has a dedicated equilibration circuit 208 to equilibrate the bit lines to a predetermined voltage provided on the EQv line. Isolation circuitry 210 is provided to selectively couple one bit line pair to a shared cross coupled pair differential n-sense amplifier circuit 212. The n-sense amplifier is activated using the NSA line. Input/output coupling circuitry 214 selectively couples one of the bit line pairs 146 to the global bit lines 148 via communication lines 216 in response to the column select signal (CS). It will be appreciated by those skilled in the art that multiple bit line pairs can be individually coupled to the global bit lines through communication lines 216 and the schematic diagram of FIG. 5 is intended to merely illustrate one embodiment of sense amplifier and coupling circuitry of a memory array.

Figure 6:
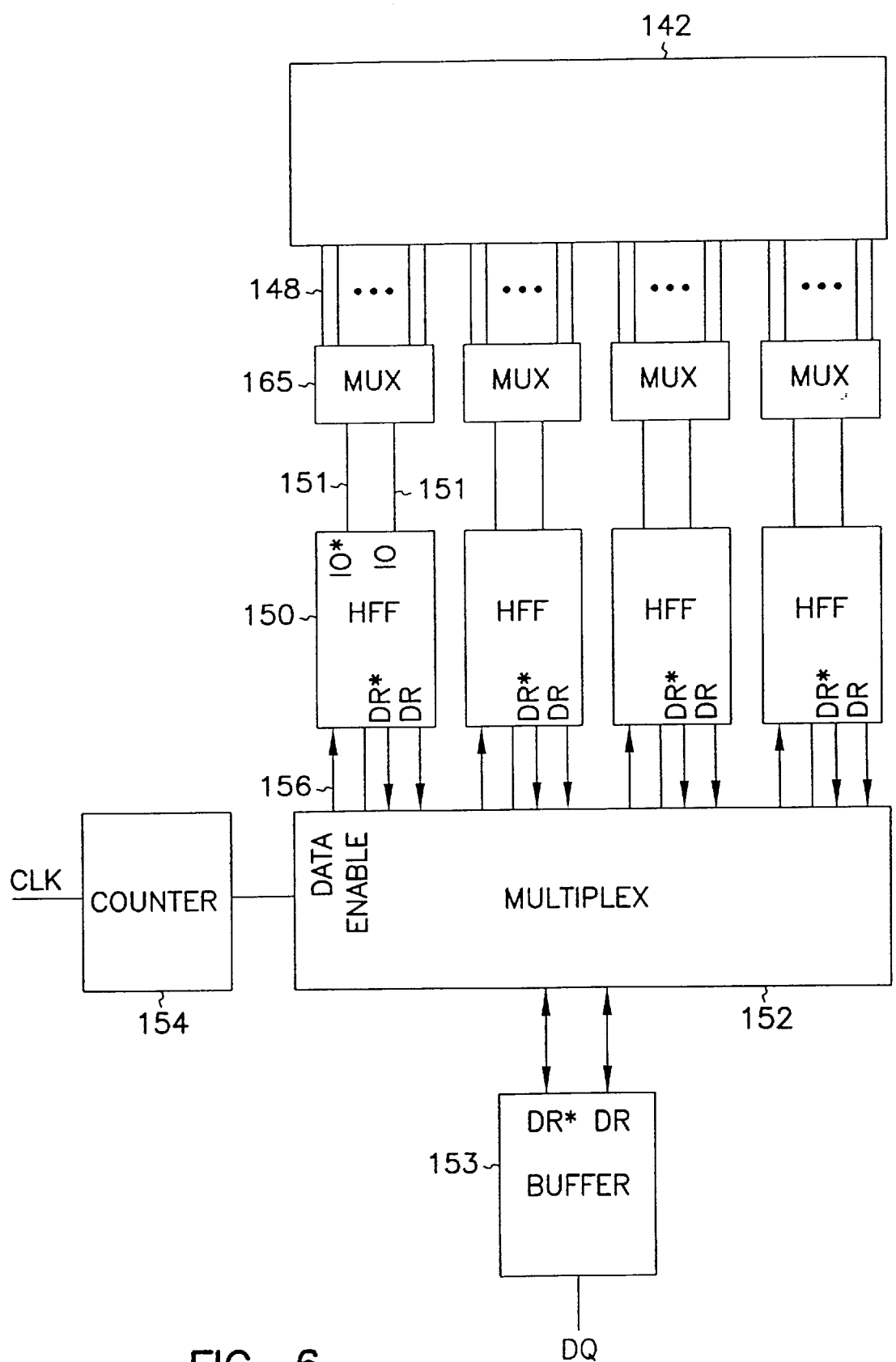
FIG. 6 is a block diagram of the data path circuitry of the memory of FIG. 2.

As stated above, the 4 Meg DRAM of FIG. 2 has 64 I/O connections, or data communication lines (DQ's). Therefore 16 DQ lines are associated with each array sub-section 142, and can be arranged as shown in FIG. 3. Each DQ is associated with 32 global bit line pairs 148. That is, one of 32 global bit line pairs can be selectively coupled to one DQ line for external data communication though eight-to-one multiplex circuits 165 and a four-to-one multiplex circuit 152. FIG. 6 shows 32 pairs of global bit lines 148 of one of the memory sub-array sections 142 connected to four eight-to-one multiplex circuits 165. Each pair of multiplex circuit output lines 151 are connected to a helper flip/flop circuit 150 which is connected to multiplex circuit 152. The multiplex circuit, in response to counter 154, couples one of the helper flip/flops to a DQ line via buffer 153. The multiplexed global bit line memory architecture of the present invention allows the memory to be operated in a pipelined synchronous mode suitable for cache applications. It will be understood that any multiplexed architecture can be used in the present invention and will be dependant upon the width (number of DQ lines) and depth (memory cell capacity) of the DRAM.

Figure 7:
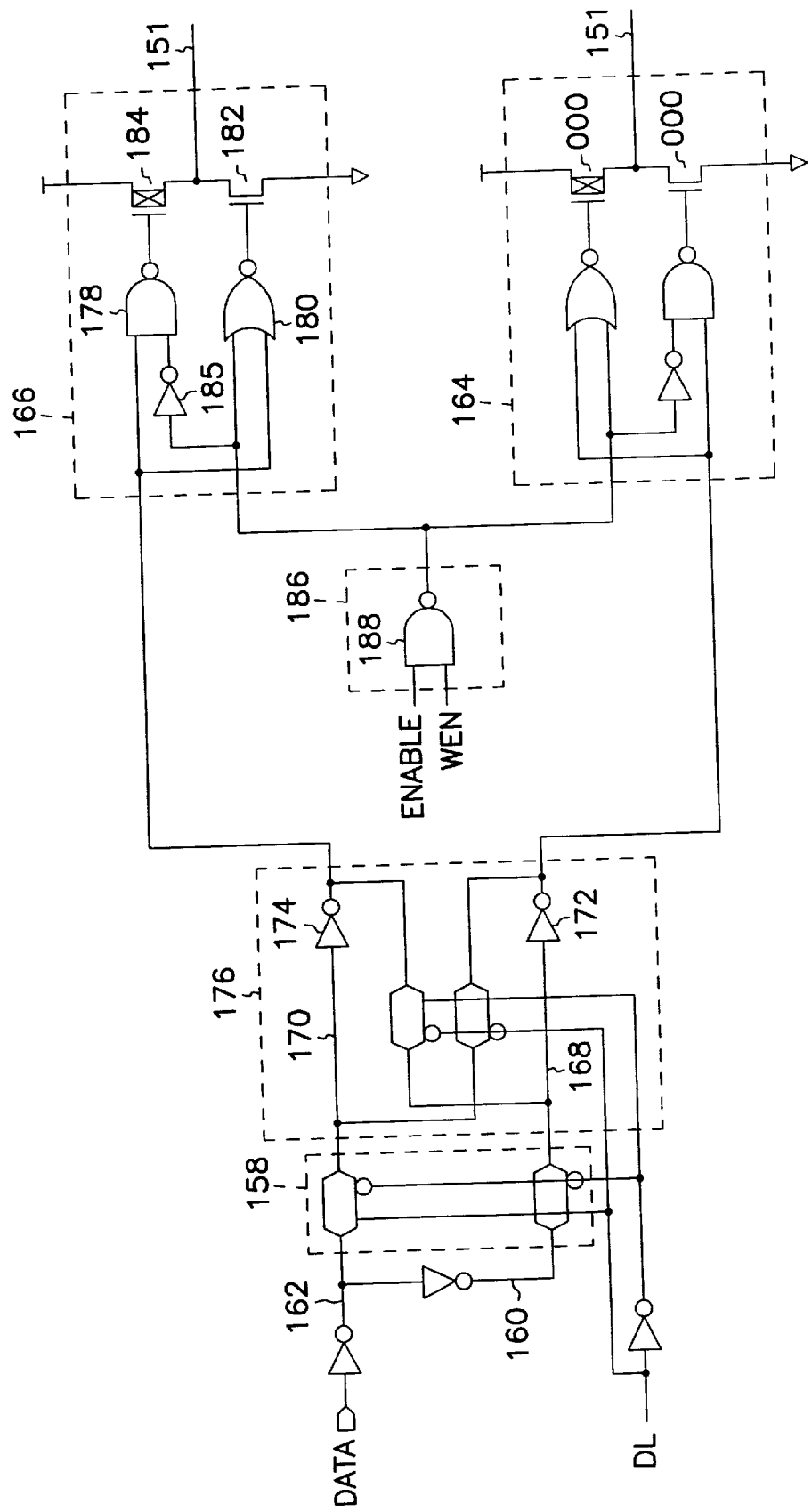
FIG. 7 is a schematic of write circuitry included in the data path circuitry of FIG. 5.
Figure 8:
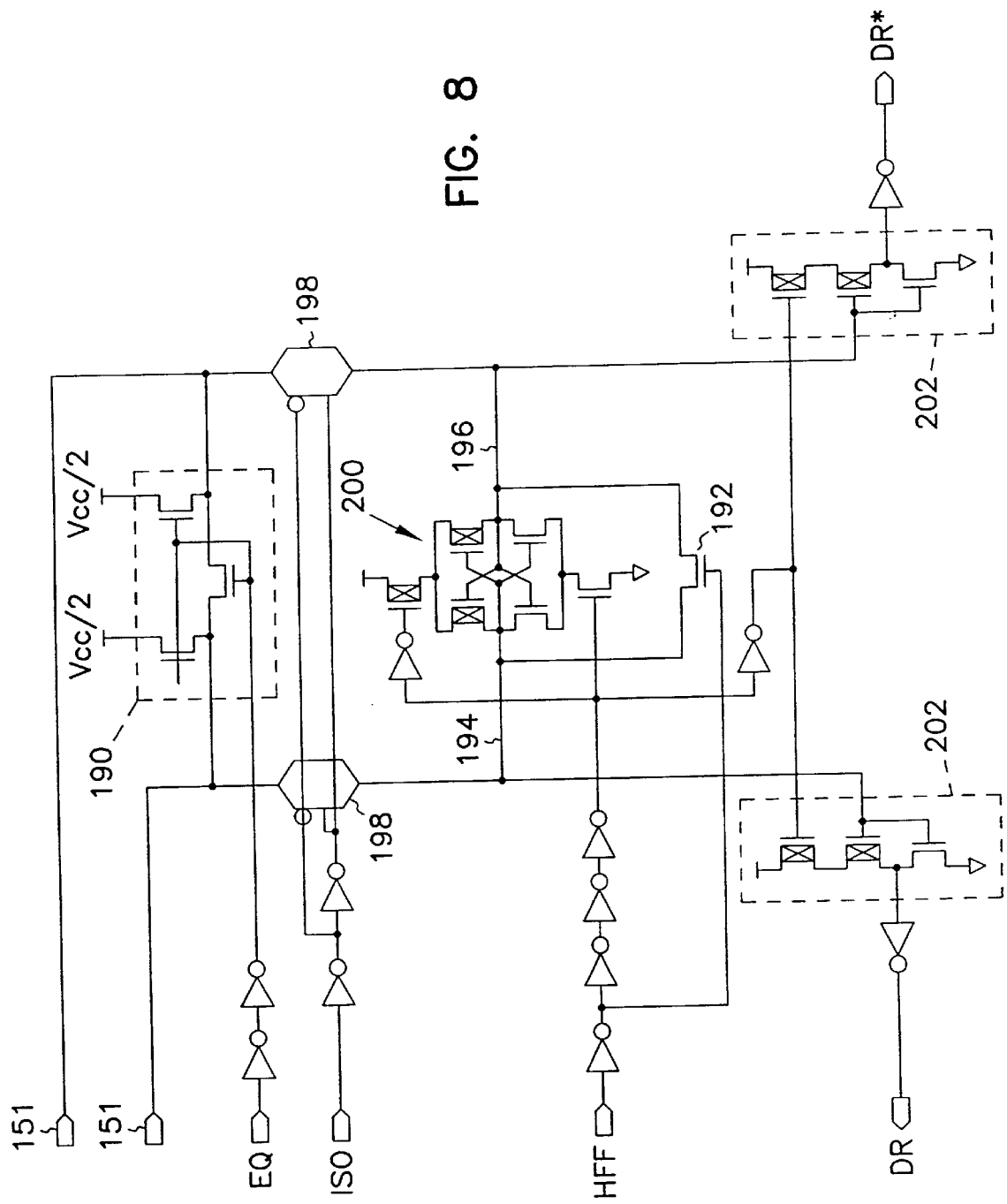
FIG. 8 is a schematic of read circuitry (helper flip/flop) of FIG. 6.

FIGS. 7 and 8 are schematic diagrams of the write and read circuitry, respectively, generally referred to in combination as helper flip/flop circuits 150 of FIG. 6. FIG. 7 is the write circuit which couples multiplexer 152 to multiplex circuit 165. During a write operation the DQ line is coupled to the DATA input line 156. Coupling circuit 158 receives both DATA and its complement DATA* at nodes 160 and 162, respectively, and couples the DATA lines to driver circuits 164 and 166 in response to a data latch signal (DL). That is, when DL is high both DATA and DATA* signals are coupled to nodes 168 and 170. When DL is low, the output of inverter 172 is coupled to the input of inverter 174 through latch circuit 176. Likewise, the output of inverter 174 is coupled to the input of inverter 172 through latch circuit 176.

The outputs from inverters 172 and 174 are coupled to driver circuits 164 and 166. Each driver circuit has a NAND gate 178, NOR gate 180, n-channel transistor 182 and a p-channel transistor 184. An inverter 185 is also provided between enable circuit 186 and an input to NAND gate 178. The enable circuit has a NAND gate 188 which provides a low output when both the helper flip/flop ENABLE signal is high and an internal Write Enable (WEN) signal is high. When the output of enable circuit 186 is low, the n-channel and p-channel transistors 182 and 184 are activated to drive the communication lines 151 to an appropriate level in response to the outputs of inverters 172 and 174. The multiplex circuits 165 couple communication lines 151 to a selected pair of global bit lines. Thus, the signal received on a DQ input is latched and coupled directly to one pair of global bit lines. It will be appreciated that data can be latched by latch 176 and not provided on communication lines 151 until the ENABLE signal is activated. Thus, data can be sequentially latched into the helper flip/flops and all of the helper flip/flops simultaneously coupled to lines 151 in response to a common ENABLE signal.

The read operation circuitry, shown in FIG. 8, uses a latch to hold data from the communication lines 151 until multiplexer circuit 152 couples the flip/flop circuit to the associated DQ line. Equilibrate circuit 190 equilibrates the communication lines 151 to a predetermined voltage such as Vcc/2 when equilibrate signal (EQ) is high. Likewise, transistor 192 equilibrates nodes 194 and 196 while the helper flip/flop enable signal (HFF) is low. Isolation devices 198 isolate the communication lines from nodes 194 and 196 in response to isolation signal (ISO). Amplifier latch circuit 200 drives nodes 194 and 196 to appropriate power rails in response to a high HFF signal. Similarly, driver circuits 202 drive the DR and DR* lines to the appropriate power rail in response to HFF, node 194 and node 196. Any sense and amplify circuit can be used as latch 200, therefore, the present invention is not limited to the cross-coupled circuit shown.

Figure 9:
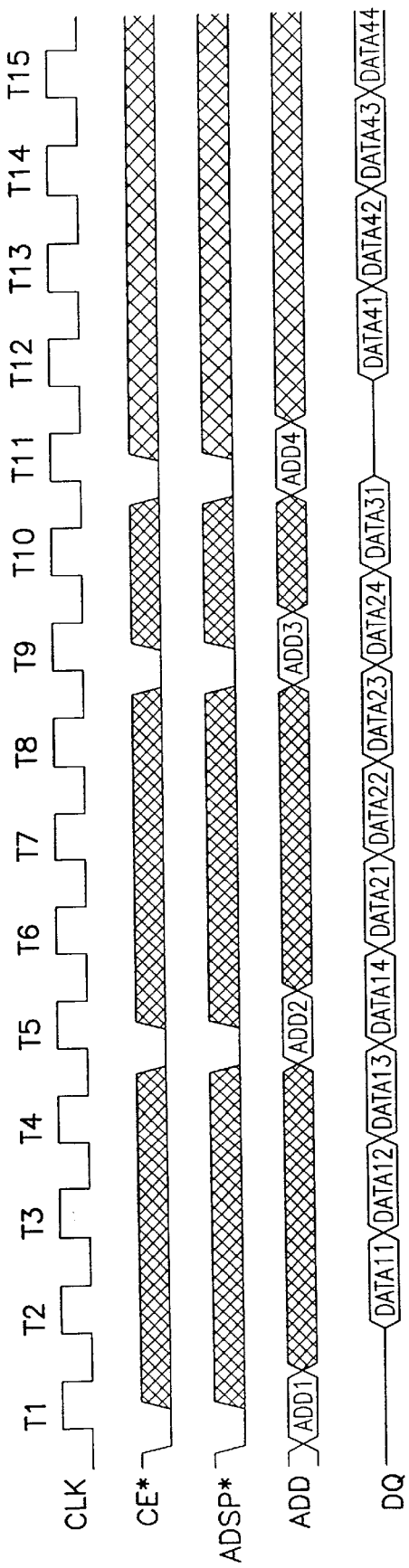
FIG. 9 is a timing diagram of a read operation of the memory of FIG. 2.
Figure 10:
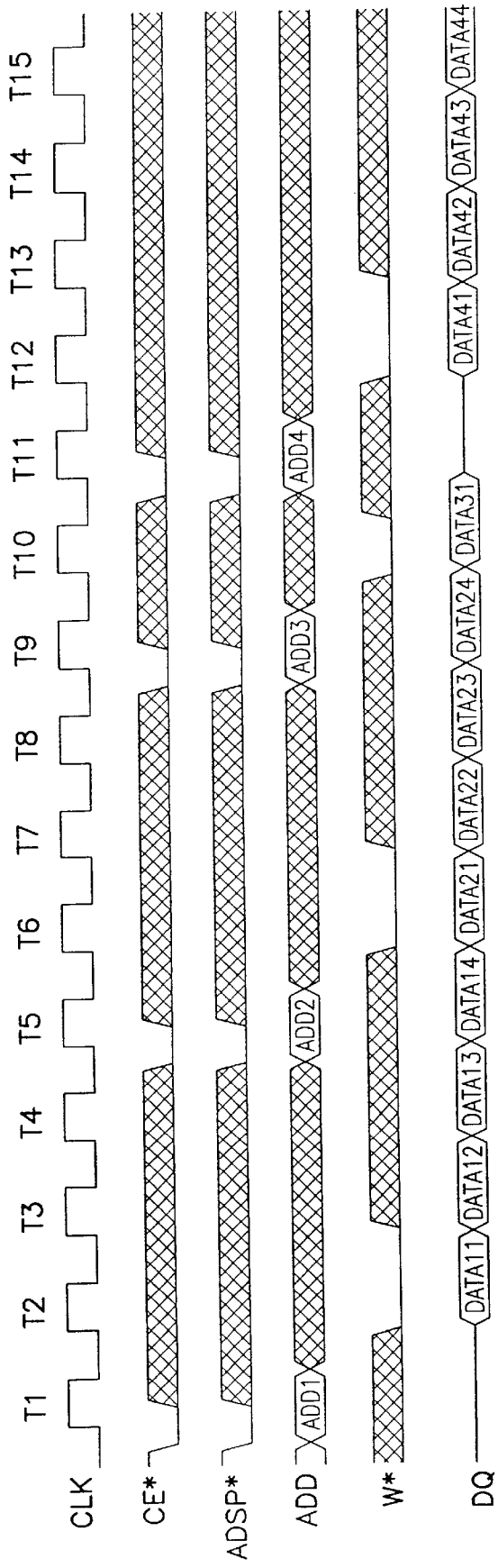
FIG. 10 is a timing diagram of a write operation of the memory of FIG. 2.

FIGS. 9 and 10 illustrate timing diagrams for synchronous pipelined read and write operations of the cache DRAM. For a synchronous read operation a memory address (ADD 1) is received from the memory address inputs on an active transition of the clock signal (high transition) at time tl. Note that the Chip Enable (CE*) signal and the Synchronous Address Status Processor (ADSP*) signal are low to cause the memory to register a new external address in response to the central processing unit. It will be understood by those skilled in the art that the Synchronous Address Status Control (ADSC*) input could be used to register a new external address in response to controller 130. On the next active clock cycle t2, data stored at address DATA11 is provided on the DQ lines. This data corresponds to memory address ADD1 and helper flip/flop 1. Subsequent active cycles of the clock (t3–t5) will output data latched in helper flip/flops 2–4 (shown as DATA12-DATA14). A new external address (ADD2) is registered on the fifth clock cycle (t5) and data DATA21–24 is output on the DQ lines starting at time t6. If an ADSP signal is received early in the output sequence, the data from additional helper flip/flops is terminated. This is illustrated by the absence of DATA32–34 during the third output sequence in response to the ADSP signal received at time t11. It will be understood that by multiplexing the flip/flops the DRAM of the present invention can output data on each clock cycle, thereby, eliminating the need for latency between output data. A clock latency is provided, however, following both the initial address and termination of an output sequence.

Referring to FIG. 10, a synchronous write operation is initiated on an active transition of the clock when a write enable signal (W*) is active. A new memory address is latched when both CE* and ADSP* are low. To operate as a standard cache memory, the cache DRAM must accept either a single write operation or a burst operation. That is, data will either be written to the memory array in a single write operation to a designated address provided on the address lines, or be written to the memory in a burst operation to a predetermined sequence of memory addresses starting at a designated address provided on the address lines. To accommodate both types of write operations, the DRAM cache memory opens and closes a page of the memory array to allow the memory to operate in a pipelined manner.

Referring to FIG. 10, upon the receipt of an address at time t, as indicated by a low ADSP* signal, the appropriate memory array page is opened by controller circuit 141, FIG. 2. The write enable signal (W*) provided at time t2 indicates that a write operation is to be performed. At this time, the memory does not know what type of write operation is to be performed, single or burst. At time t2 the data provided on the DQ lines is latched in a helper flip/flop and then written to the memory array page, as described above with reference to FIG. 7. The controller 141 closes the accessed page prior to time t3. If the write enable signal is active at time t3, the page is re-opened and the burst write operation is continued by latching the data and then writing the latched data to the memory array, as shown in FIG. 10. After DATA14 is written to the memory array, the page is closed in preparation of a new address at time t5.

If a new address alert (ADSP*) signal is received after a single write operation, the memory array page corresponding to the address is accessed and prepared for either a read or write operation. As stated above, data can be latched in several helper flip/flops and then simultaneously written to memory cells through global bit lines. When a new address is received, therefore, the previous data sequence has been transferred to the memory array.

CONCLUSION

A dynamic memory device has been described which includes multiplexed global bit lines. Memory cells can be selectively coupled to the global bit lines, and a group of global bit lines are multiplexed to data communication connections (DQ lines). The multiplexed architecture allows the DRAM to read and write data at speeds needed to function as cache memory.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, any size memory array can be used, including 256k, 1 meg, 2 meg, 4 meg, 8 meg and 16 meg, and any number of DQ lines can be used, including 4, 8, 16, 32 and 64. Therefore, it is manifestly intended that this invention be limited only by the claims and the equivalents thereof.

What is claimed is:

1. A dynamic cache memory device comprising:
a plurality of dynamic memory cells;
a plurality of bit lines;
a plurality of access devices connected between the plurality of dynamic memory cells and the plurality of bit lines for selectively coupling one of the plurality of dynamic memory cells to one of the plurality of bit lines;
a plurality of global bit lines coupled to the plurality of bit lines;
addressing circuitry to electrically connect the plurality of global bit lines to a plurality of latch circuits; and
a multiplex circuit connected between the plurality of latch circuits and an input/output connection for coupling one of the plurality of latch circuits to the input/output connection.

2. The dynamic cache memory device of claim 1 further comprising:
a plurality of sense amplifier circuits electrically located between the plurality of global bit lines and the plurality of bit lines.

3. The dynamic cache memory device of claim 2 further comprising:
sense amplifier address circuitry connected to the plurality of sense amplifier circuits for selectively connecting one of the plurality of sense amplifier circuits to one of the plurality of global bit lines.

4. The dynamic cache memory device of claim 1 further comprising:
a counter connected to the multiplex circuit to advance the multiplex circuit and couple the one of the plurality of latch circuits to the input/output connection.

5. The dynamic cache memory device of claim 1 further comprising:
a second multiplex circuit located between the plurality of global bit lines and the plurality of latch circuits for selectively coupling one of the plurality of global bit lines to one of the plurality of latch circuits.

6. The dynamic cache memory device of claim 1 wherein the plurality of global bit lines are fabricated parallel to the plurality of bit lines on an integrated circuit.

7. A processing system comprising:
a central processing unit; and
a DRAM cache memory comprising:
a plurality of dynamic memory cells,
a plurality of bit lines,
a plurality of access devices connected between the plurality of dynamic memory cells and the plurality of bit lines for selectively coupling one of the plurality of dynamic memory cells to one of the plurality of bit lines,
a plurality of global bit lines coupled to the plurality of bit lines,
addressing circuitry to electrically connect the plurality of global bit lines to a plurality of latch circuits, and
a multiplex circuit connected between the plurality of latch circuits and an input/output connection for coupling one of the plurality of latch circuits to the input/output connection.

8. The processing system of claim 7 wherein the DRAM cache memory further comprises:
a plurality of sense amplifier circuits electrically located between the plurality of global bit lines and the plurality of bit lines.

9. The processing system of claim 8 wherein the DRAM cache memory further comprises:
sense amplifier address circuitry connected to the plurality of sense amplifier circuits for selectively connecting one of the plurality of sense amplifier circuits to one of the plurality of global bit lines.

10. The processing system of claim 7 wherein the DRAM cache memory further comprising:
a counter connected to the multiplex circuit to advance the multiplex circuit and couple a different one of the plurality of latch circuits to the input/output connection.

11. The processing system of claim 7 wherein the DRAM cache memory further comprising:
a second multiplex circuit located between the plurality of global bit lines and the plurality of latch circuits for selectively coupling one of the plurality of global bit lines to one of the plurality of latch circuits.

12. The processing system of claim 7 wherein the plurality of global bit lines are fabricated parallel to the plurality of bit lines on an integrated circuit.

13. An integrated circuit package comprising:
central processing circuitry; and
DRAM cache memory circuitry comprising:
dynamic memory cells and bit lines,
access devices connected between the dynamic memory cells and the bit lines for selectively coupling one of the dynamic memory cells to one of the bit lines,
global bit lines selectively coupled to the bit lines,
addressing circuitry to electrically connect the global bit lines to latch circuits, and
a multiplex circuit connected between the latch circuits and the central processing circuitry for coupling one of the latch circuits to the central processing circuitry.

14. A method of outputting data from a dynamic cache memory device, the method comprising the steps of:
reading data from a plurality of dynamic memory cells;
coupling the data to a plurality of global bit lines;
coupling the plurality of global bit lines to a plurality of latch circuits;
latching the data in the plurality of latch circuits;
multiplexing one of the plurality of latch circuits to a data input/output connection on a first clock signal; and
multiplexing different ones of the plurality of latch circuits to the data input/output connection on subsequent clock signals.

15. The method of claim 14 further comprising the steps of:
receiving an address signal on address inputs; and
accessing the plurality of dynamic memory cells in response to the address signal.

16. The method of claim 14 further comprising the steps of:
receiving a chip enable signal from an external processor.

17. A method of inputting data to a dynamic cache memory device, the method comprising the steps of:
coupling a plurality of memory cells to a plurality of global bit lines;
connecting the plurality of global bit lines to a plurality of latch circuits;
receiving data on an input/output connection;
multiplexing one of the plurality of latch circuits to the input/output connection on a first clock signal to latch the data; and multiplexing different ones of the plurality of latch circuits to the data input/output connection on subsequent clock signals to latch the data.

18. The method of claim 17 further comprising the steps of:

receiving an address signal on address inputs; and accessing the plurality of dynamic memory cells in response to the address signal.

19. The method of claim 17 further comprising the steps of:

receiving a chip enable signal from an external processor.

20. The method of claim 17 further comprising the steps of:

storing the data latched by the plurality of latch circuits to the plurality of memory cells.

21. The method of claim 20 wherein the step of storing the data comprises:

simultaneously coupling the plurality of latch circuits to global bit lines; and coupling the global bit lines to the plurality of memory cells.

22. A method of operating a processing system comprising a central processing unit (CPU) and a DRAM cache memory, the method comprising the steps of:

providing control signals from the CPU to the DRAM cache memory to initiate a write operation;

providing data from the CPU to the DRAM cache memory on a data input/output connection;

receiving the data with the DRAM cache memory;

multiplexing one of a plurality of latch circuits of the DRAM cache memory to the input/output connection on a first clock signal to latch the data; and multiplexing different ones of the plurality of latch circuits to the data input/output connection on subsequent clock signals to latch the data.

23. A method of operating a processing system comprising a central processing unit (CPU) and a DRAM cache memory, the method comprising the steps of:

providing control signals from the CPU to the DRAM cache memory to initiate a read operation;

reading data from a plurality of dynamic memory cells provided in the DRAM cache memory;

coupling the data to a plurality of global bit lines;

coupling the plurality of global bit lines to a plurality of latch circuits;

latching the data in the plurality of latch circuits;

multiplexing one of the plurality of latch circuits to a data input/output connection on a first clock signal;

multiplexing different ones of the plurality of latch circuits to the data input/output connection on subsequent clock signals; and receiving the data with the CPU via the input/output connection.

* * * * *